United States Patent

Bae et al.

[11] Patent Number: 5,892,240
[45] Date of Patent: Apr. 6, 1999

[54] WAFER SENSING APPARATUS FOR SENSING WAFER INSERTION

[75] Inventors: Kyoung-jeong Bae; Kwon Son, both of Yongin, Rep. of Korea

[73] Assignee: Samsung Electronics Co., Ltd., Suwon, Rep. of Korea

[21] Appl. No.: 770,442

[22] Filed: Dec. 20, 1996

[30] Foreign Application Priority Data

Dec. 22, 1995 [KR] Rep. of Korea .................. 1995-54712

[51] Int. Cl.⁶ .................................................. G01N 21/84
[52] U.S. Cl. .................................. 250/559.4; 250/214 B; 414/937
[58] Field of Search ..................................... 356/416, 375; 250/559.4, 214 B, 214 C; 414/937, 938

[56] References Cited

U.S. PATENT DOCUMENTS 4,093,384  6/1978  Ferguson .................................. 356/416
5,225,691  7/1993  Powers et al. ......................... 250/559.4

FOREIGN PATENT DOCUMENTS 6-85042  3/1994  Japan .................................. 250/559.4

*Primary Examiner*—F. L. Evans
*Attorney, Agent, or Firm*—Jones & Volentine, L.L.P.

[57] ABSTRACT

A wafer sensing apparatus for sensing whether a wafer is inserted in a wafer cassette. The wafer sensing apparatus includes a light emitting device for emitting light of a predetermined wavelength toward the inside of a wafer cassette, a light sensing device, positioned opposite to the light emitting device, for sensing the emitted light, and an optical filter device for passing light corresponding only to the predetermined wavelength of light emitted from the light emitting device. The light sensing device is not affected by interference light from outside sources that can cause a faulty wafer sensing function, since the interfering light is reflected or absorbed by the optical filter device. Equipment malfunctions caused by faulty sensing from the light sensing device are prevented, thereby improving the equipment operating efficiency.

2 Claims, 3 Drawing Sheets ic apparatus,
WAFER SENSING APPARATUS FOR SENSING WAFER INSERTION

BACKGROUND OF THE INVENTION

The present invention relates to a wafer sensing apparatus, and more particularly, to a wafer sensing apparatus for sensing whether or not a wafer is inserted in a wafer cassette, thereby preventing the malfunctioning of a robot arm due to the faulty sensing of the wafer insertion. Such a wafer sensing apparatus would result in an improvement in equipment operating efficiency.

Generally, the transfer process of loading and unloading a wafer from a piece of semiconductor process equipment—used for fabricating a semiconductor device—is performed automatically using a robot arm to prevent the generation of polluting particles. In this transfer process, it is essential to quickly and accurately determine whether or not a wafer is inserted into respective wafer holding slots formed in a wafer cassette.

The wafer insertion sensing operation is performed by a wafer sensing apparatus having a light emitting means for emitting light toward the wafer cassette, with the emitted light being parallel with respect to the slots. A light sensing means opposing the light emitting means senses the light emitted from the light emitting means.

Suppose for example, that through an error, another wafer has previously been inserted into a slot of the wafer cassette into which a wafer completing a predetermined process should be inserted. In this case, the light sensing means cannot sense the light emitted from the light emitting means since the light is blocked by the previously inserted wafer. In such a case the wafer transfer operation would stop with an error message, such as "CASSETTE SLOT NOT EMPTY", being generated.

However, if the wafer transferring operation continued under the above situation despite the wafer error message, due to a problem with the wafer sensing apparatus for example, it could result in two wafers that are trying to be inserted in the same cassette slot, whereby the wafers or a pair of wafer transferring tweezers made of quartz are susceptible to being broken.

On the other hand, an error could also occur even if there were no previously inserted wafer in the wafer cassette before a wafer completing a predetermined process was to be inserted into the corresponding wafer cassette slot. For example, an error in the wafer sensing apparatus could cause the transfer operation to stop automatically, with an error message such as "CASSETTE SLOT NOT EMPTY" as described above being generated, even though no actual wafer was in the slot. This would result in a lowering of the equipment working rate.

FIG. 1 is a perspective view schematically showing a conventional wafer sensing apparatus and the wafer sensing operation thereof.

Referring to FIG. 1, a conventional wafer sensing apparatus is constituted by a light emitting means 3 and a light sensing means 5. The light sensing means 5 includes a main body 6, a plurality of aperture slots 7, and light sensing devices (not shown). A plurality of wafers 1 are inserted into slots formed in a wafer cassette 4. The wafer transferring operation is performed by a robot arm 2 which detachably attaches to the rear side of each wafer 1 using vacuum suction. The light emitting device 3, positioned under the robot arm 2, emits light a toward the inner portion of the wafer cassette 4. The emitted light a either passes through the wafer cassette 4 via an empty slot, or is blocked by the wafer 1. The passed light a also passes through one of the plurality of aperture slots 7 formed on the surface of the main body 6, and is then sensed by the light sensing devices (not shown). The location of the light sensing devices is determined according to the respective aperture slots 7.

Generally, the light sensing device can sense a light in a predetermined wavelength range. For example, an infrared ray sensor senses a light in a wavelength range of about 800 to 1100 nm. However, in the conventional wafer sensing apparatus for sensing whether the wafer is inserted or not, having the structure described above, the light sensing device may erroneously sense whether the wafer is inserted due to interference from interference light b. Such interference light may come from a number of outside sources, such as overhead or space lighting from the fabrication facility where the processing equipment is located, or radiant light from the infrared rays emitted from a highly heated piece of processing equipment. When the wafer sensing apparatus malfunctions due to the faulty sensing of the light sensing device, the equipment operating efficiency is lowered, and breakage of the wafer or wafer handling devices may occur.

SUMMARY OF THE INVENTION

It is an object of the present invention to provide a wafer sensing apparatus for correctly sensing whether or not a wafer is inserted in a wafer cassette, which prevents the malfunctioning of a robot arm due to the faulty sensing of the wafer insertion by a light sensing device, resulting in an improvement in equipment operating efficiency.

To achieve the above object, there is provided a wafer sensing apparatus for sensing whether a wafer is inserted in a wafer cassette, comprising: a light emitting means for emitting light of a predetermined wavelength toward the inside of a wafer cassette; a light sensing means, positioned opposite to the light emitting means, for sensing the emitted light; and optical filter means for passing light corresponding only to the predetermined wavelength of light emitted from the light emitting means.

It is preferable that the optical filter means be located between the light emitting means and the light sensing means, and the optical filter means passes light corresponding only to the wavelength of 800 to 1100 nm.

According to the wafer sensing apparatus of the present invention, the light sensing means is not affected by interference light from outside sources that can cause a faulty wafer sensing function, since the interfering light is reflected or absorbed by the optical filter means. Equipment malfunctions caused by faulty sensing from the light sensing means are prevented, thereby improving the equipment operating efficiency.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
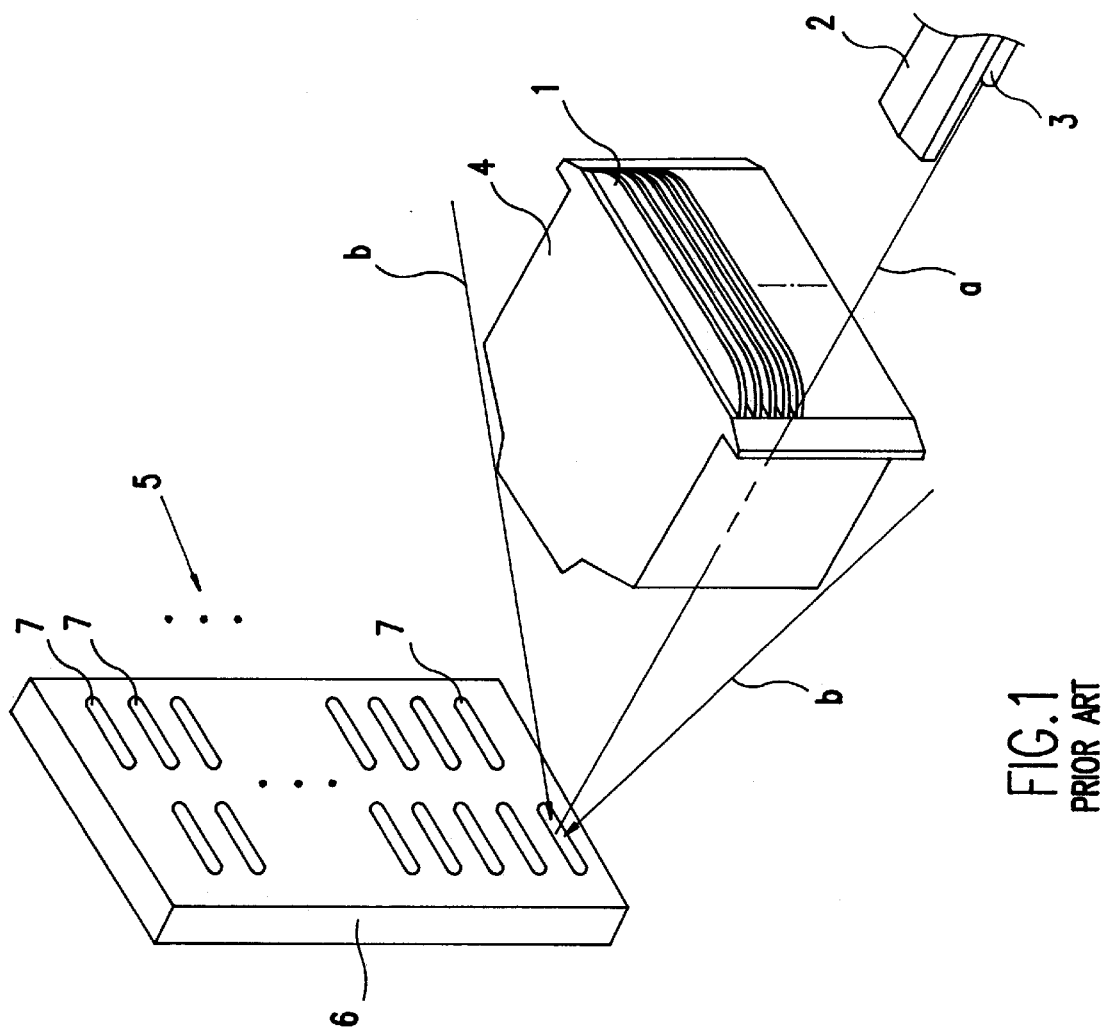
FIG. 1 is a perspective view schematically showing a conventional wafer sensing apparatus for sensing whether a wafer is inserted and the wafer sensing operation thereof.
Figure 2:
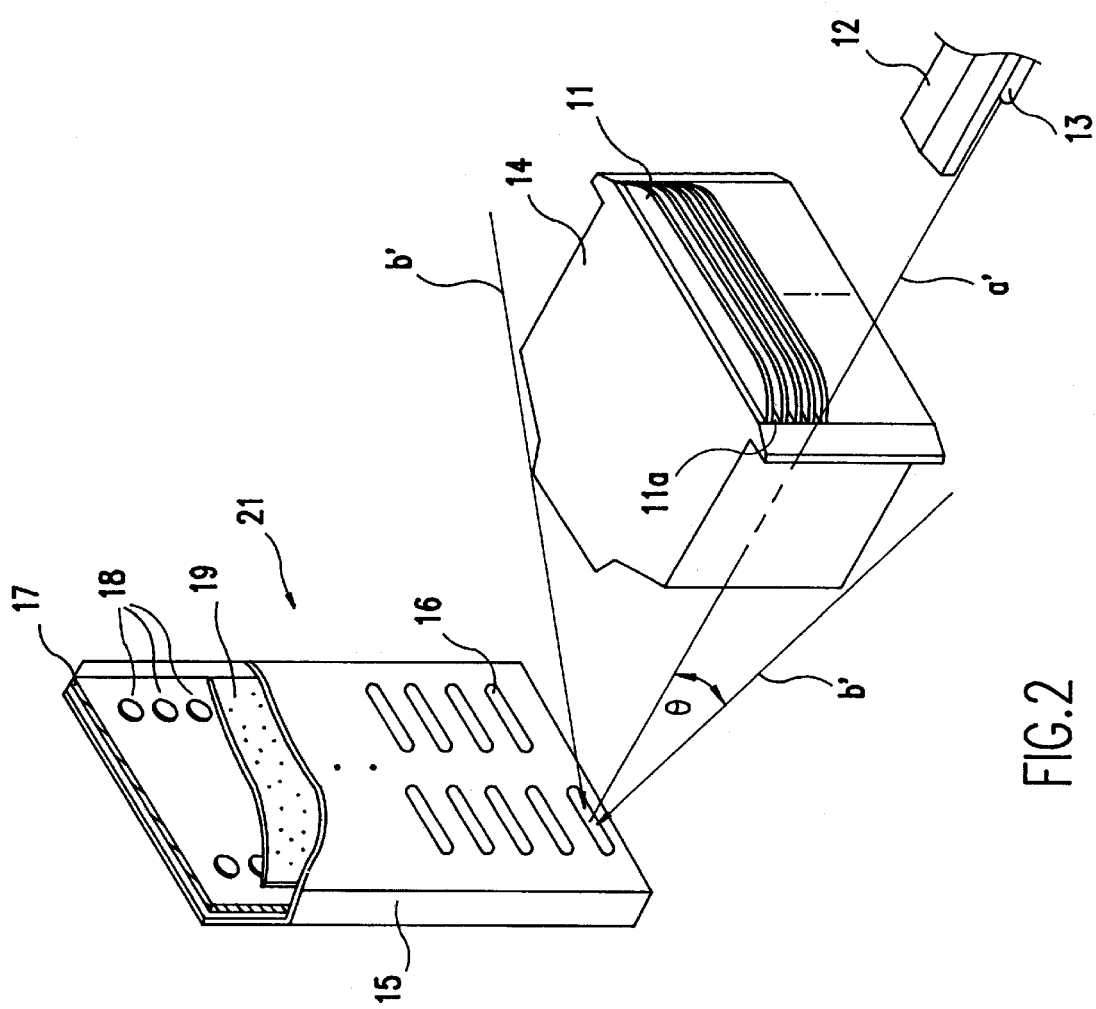
FIG. 2 is a perspective view schematically showing a wafer sensing apparatus according to present invention.

An exemplary embodiment of the invention will now be described with reference to FIGS. 2 and 3. In FIG. 2, a main body 15 of light sensing means 21 is partially cut away to show a plurality of light sensing devices 18. Also, a plurality of wafers 11 are inserted into respective wafer holding slots 11a formed in a wafer cassette 14. The wafer transferring operation is performed by a robot arm 12 which detachably attaches to the rear side of each wafer 11 by vacuum suction.

Under the robot arm 12, a light emitting means 13 emits light a' toward the inner portion of the wafer cassette 14. The light emitting means 13 may be, for example, a light emitting diode (LED). The emitted light a' either passes through the wafer cassette 14 via an empty slot, or is blocked by the wafer 11. The passed light a' also passes through an aperture slot 16 formed on the surface of the main body 15 and then is sensed by one of the plurality of light sensing devices 18 which is mounted on a printed circuit board 17. The light sensing devices 18 may be, for example, a uni-junction transistor (UJT). The location of the light sensing devices 18 is determined according to the respective aperture slots 16, which also correspond to the respective wafer holding slots 11a in wafer cassette 14. An optical filter 19 is located between the plurality of aperture slots 16 and the plurality of light sensing devices 18.

Figure 3:
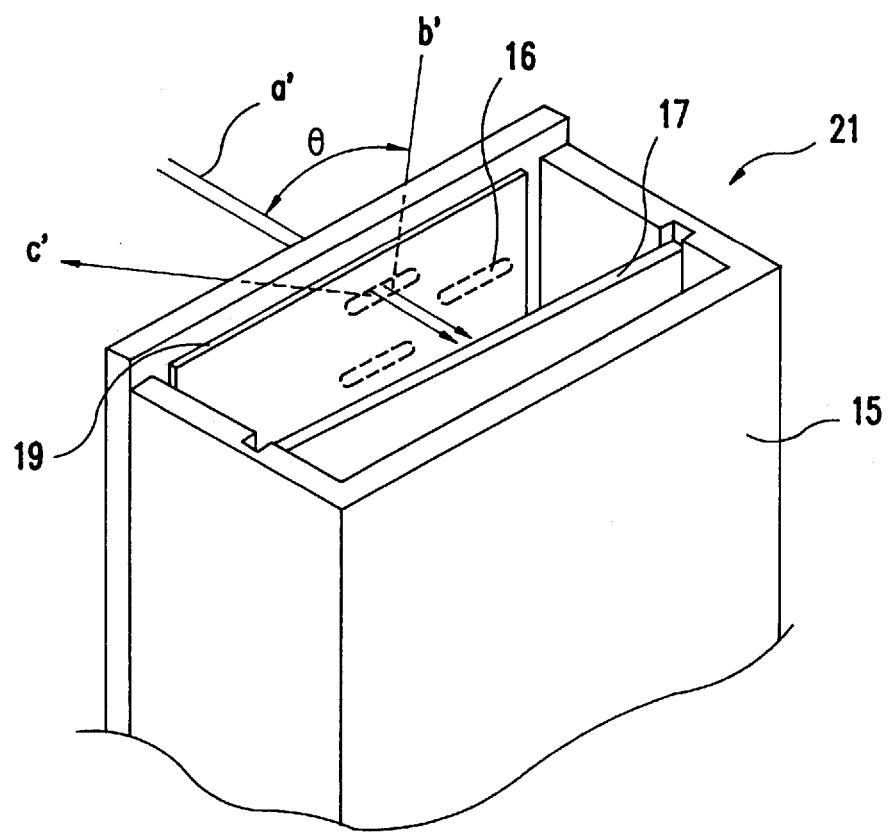
FIG. 3 is a rear perspective view of the light sensing portion of the present invention.

FIG. 3 is a rear perspective view of the light sensing portion of the present invention, wherein the cover of the main body 15 is removed.

Referring to FIG. 3, the emitted light a' passes through the aperture slot 16 and the optical filter 19. The plurality of aperture slots 16 are formed on the front surface of the main body 15 corresponding to the position of wafer holding slots 11a in wafer cassette 14. The optical filter 19, which is located between the aperture slot 16 and the printed circuit board 17, passes only the light a' emitted from the light emitting means 13 (FIG. 2). Therefore, the optical filter 19 should have a wavelength pass band corresponding to the wavelength of the light emitted from the light emitting means 13.

On the other hand, interference light b' from the outside usually has a large incidence angle θ. Such interference light may come from a number of outside sources, such as overhead or space lighting from the fabrication facility where the processing equipment is located, or radiant light from the infrared rays emitted from a highly heated piece of processing equipment. Thus, the interference light b' is reflected as a light c' on the surface of optical filter 19, or absorbed at the inside of optical filter 19.

Also, if the wavelength sensed by the light sensing device is an infrared ray, the optical filter 19 will only pass light having the wavelength of 800 to 1100 nm. It is contemplated that other wavelengths of light can be accommodated within the practice of the present invention by changing the optical filter.

Thus, according to the above preferred embodiment of the present invention, the light sensing device is not affected by the interference light. Therefore, robot arm and equipment malfunctions caused by erroneous sensing of the light sensing devices is prevented, thereby improving the equipment operating efficiency.

While the present invention has been illustrated and described with reference to the specific embodiment, the present invention is not limited to the particular form illustrated and further modifications and alterations will occur to those skilled in the art.

What is claimed is:

1. A wafer sensing apparatus for sensing whether a wafer is inserted in a wafer cassette, comprising:

light emitting means for emitting light of a predetermined wavelength toward the inside of a wafer cassette;

light sensing means, including a main body having a plurality of aperture slots, each of said plurality of aperture slots being positioned according to corresponding positions of wafer holding slots formed in said wafer cassette, and including a plurality of light sensing devices formed on a circuit board housed in said main body for sensing the light passed through said aperture slots, said light sensing means positioned opposite to said light emitting means, for sensing only the emitted light; and optical filter means disposed between said aperture slots and said light sensing devices for passing light corresponding only to the predetermined wavelength of the emitted light from said light emitting means.

2. A wafer sensing apparatus as claimed in claim 1, wherein said optical filter means passes light corresponding to the predetermined wavelength of 800 to 1100 nm.

* * * * *